(12) United States Patent
Erickson et al.

(10) Patent No.: US 11,927,543 B2
(45) Date of Patent: *Mar. 12, 2024

(54) MULTIPLE REFLECTOMETRY FOR MEASURING ETCH PARAMETERS

(71) Applicant: Applied Materials, Inc., Santa Clara, CA (US)

(72) Inventors: Blake Erickson, Gilroy, CA (US); Keith Berding, Truckee, CA (US); Michael Kutney, Santa Clara, CA (US); Soumendra Barman, San Jose, CA (US); Zhaozhao Zhu, Milpitas, CA (US); Michelle SanPedro, Mountain View, CA (US); Suresh Polali Narayana Rao, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/101,869

(22) Filed: Jan. 26, 2023

(65) Prior Publication Data

US 2023/0168210 A1 Jun. 1, 2023

Related U.S. Application Data

(63) Continuation of application No. 17/242,569, filed on Apr. 28, 2021, now Pat. No. 11,619,594.

(51) Int. Cl.
*G02F 1/01* (2006.01)
*G01B 11/06* (2006.01)
(Continued)

(52) U.S. Cl.
CPC ..... *G01N 21/9501* (2013.01); *G01B 11/0616* (2013.01); *G01N 21/211* (2013.01)

(58) Field of Classification Search
CPC ............. G01N 21/9501; G01N 21/211; G01B 11/0616
(Continued)

(56) References Cited

U.S. PATENT DOCUMENTS 5,664,033 A 9/1997 Scheu
5,982,018 A * 11/1999 Wark ............... H01L 23/642
257/E21.705

(Continued)

FOREIGN PATENT DOCUMENTS

CN 106840820 A * 6/2017 ............... G01N 1/32
CN 109863377 A 6/2019
(Continued)

OTHER PUBLICATIONS

PCT Notification of Transmittal of the International Search Report and the Written Opinion of the International Searching Authority for PCT Application No. PCT/US2022/026197, dated Aug. 9, 2022, 11 pages.

(Continued)

*Primary Examiner* — Michael A Lyons
*Assistant Examiner* — Omar H Nixon
(74) *Attorney, Agent, or Firm* — Lowenstein Sandler LLP

(57) ABSTRACT

A system includes a memory, and at least one processing device, operatively coupled to the memory, to facilitate an etch recipe development process by performing operations including obtaining, from an optical detector, first material thickness data for a first material and second material thickness data for a second material resulting from an iteration of an etch process using an etch recipe. The first material is located at a first reflectometry measurement point and the second material is located at a second reflectometry measurement point different from the first reflectometry measurement point. The operations further include deter- (Continued)

mining one or more etch parameters based on at least the first material thickness data and the second material thickness data.

20 Claims, 6 Drawing Sheets

(51) Int. Cl.
    *G01N 21/21*     (2006.01)
    *G01N 21/95*     (2006.01)

(58) Field of Classification Search
    USPC ........................................................ 356/237.5
    See application file for complete search history.

(56) References Cited

U.S. PATENT DOCUMENTS

| | | | |
|---|---|---|---|
| 6,576,476 | B1 | 6/2003 | Taylor |
| 8,334,986 | B2 | 12/2012 | Moll |
| 2008/0087638 | A1 | 4/2008 | Brcka |
| 2008/0176149 | A1 | 7/2008 | Grimbergen |
| 2009/0065478 | A1 | 3/2009 | Dockery |
| 2012/0293788 | A1 | 11/2012 | Shibazaki |
| 2019/0331592 | A1 | 10/2019 | Dighe |
| 2021/0348919 | A1* | 11/2021 | Kloza ................ G01B 17/02 |

FOREIGN PATENT DOCUMENTS

| | | |
|---|---|---|
| JP | 2008064747 A | 3/2008 |
| WO | 2014203161 A1 | 12/2014 |

OTHER PUBLICATIONS

USPTO, Office Action for U.S. Appl. No. 17/242,569, dated Jun. 27, 2022.

USPTO, Notice of Allowance for U.S. Appl. No. 17/242,569, dated Oct. 5, 2022.

\* cited by examiner

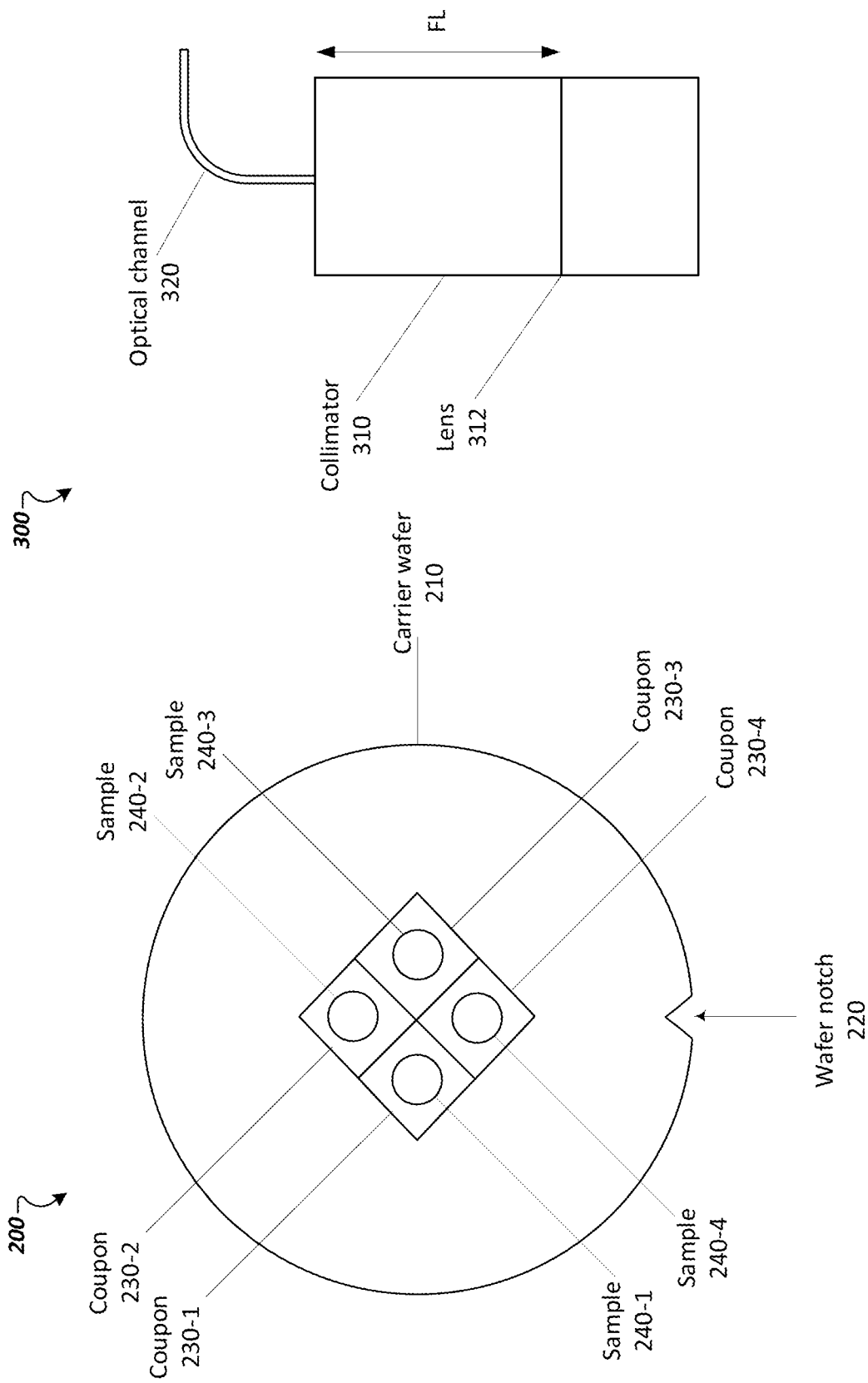

MULTIPLE REFLECTOMETRY FOR MEASURING ETCH PARAMETERS

RELATED APPLICATIONS

This application is a continuation of U.S. patent application Ser. No. 17/242,569, filed on Apr. 28, 2021 and entitled "MULTIPLE REFLECTOMETRY FOR MEASURING ETCH PARAMETERS", the entire contents of which are incorporated by reference herein.

TECHNICAL FIELD

The present disclosure relates generally to electronic device fabrication, and, more particularly, relates to multiple reflectometry for measuring etch parameters.

BACKGROUND

Manufacturing systems produce products based on manufacturing parameters. For example, substrate processing systems produce substrates based on the many parameters of process recipes. Products have performance data based on what parameters were used during production. Etch process equipment can be used to remove material from areas of a substrate through, e.g., chemical reaction and/or physical bombardment. For example, vacuum etch processes can use plasma to generate gas-phase reactants. During etch processing, an etch rate refers to a rate of material removal, and etch selectivity refers to a ratio of etch rates observed in two materials. There can be a plurality of materials of interest during etch. Such materials include: (1) a target material to be etched; (2) a material underneath the target material; (3) a mask material; and (4) adjacent material to the target material that may be exposed to the etch processing (e.g., process gas).

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a system includes a memory, and at least one processing device, operatively coupled to the memory, to facilitate an etch recipe development process by performing operations including obtaining, from an optical detector, first material thickness data for a first material and second material thickness data for a second material resulting from an iteration of an etch process using an etch recipe. The first material is located at a first reflectometry measurement point and the second material is located at a second reflectometry measurement point different from the first reflectometry measurement point. The operations further include determining one or more etch parameters based on at least the first material thickness data and the second material thickness data.

In another aspect of the disclosure, a method includes obtaining, by at least one processing device from an optical detector, first material thickness data for a first material and second material thickness data for a second material resulting from an iteration of an etch process using an etch recipe. The first material is located at a first reflectometry measurement point and the second material is located at a second reflectometry measurement point different from the first reflectometry measurement point. The method further includes determining, by the at least one processing device, one or more etch parameters based on at least the first material thickness data and the second material thickness data.

In another aspect of the disclosure, a system includes an optical detector, operatively coupled to a switch device, to selectively measure material thickness data resulting from an iteration of an etch process. The system further includes at least one processing device, operatively coupled to the optical detector and the switch device, to facilitate an etch recipe development process by determining one or more etch parameters based on at least first material thickness data for a first material and second material thickness data for a second material. The first material is located at a first reflectometry measurement point and the second material is located at a second reflectometry measurement point different from the first reflectometry measurement point.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2 is a top-down view of a carrier wafer apparatus for use within the MIEP system of FIG. 1, according to some embodiments.

FIG. 3 is a cross-sectional view of a collimator assembly, according to some embodiments.

DETAILED DESCRIPTION

Figure 1:
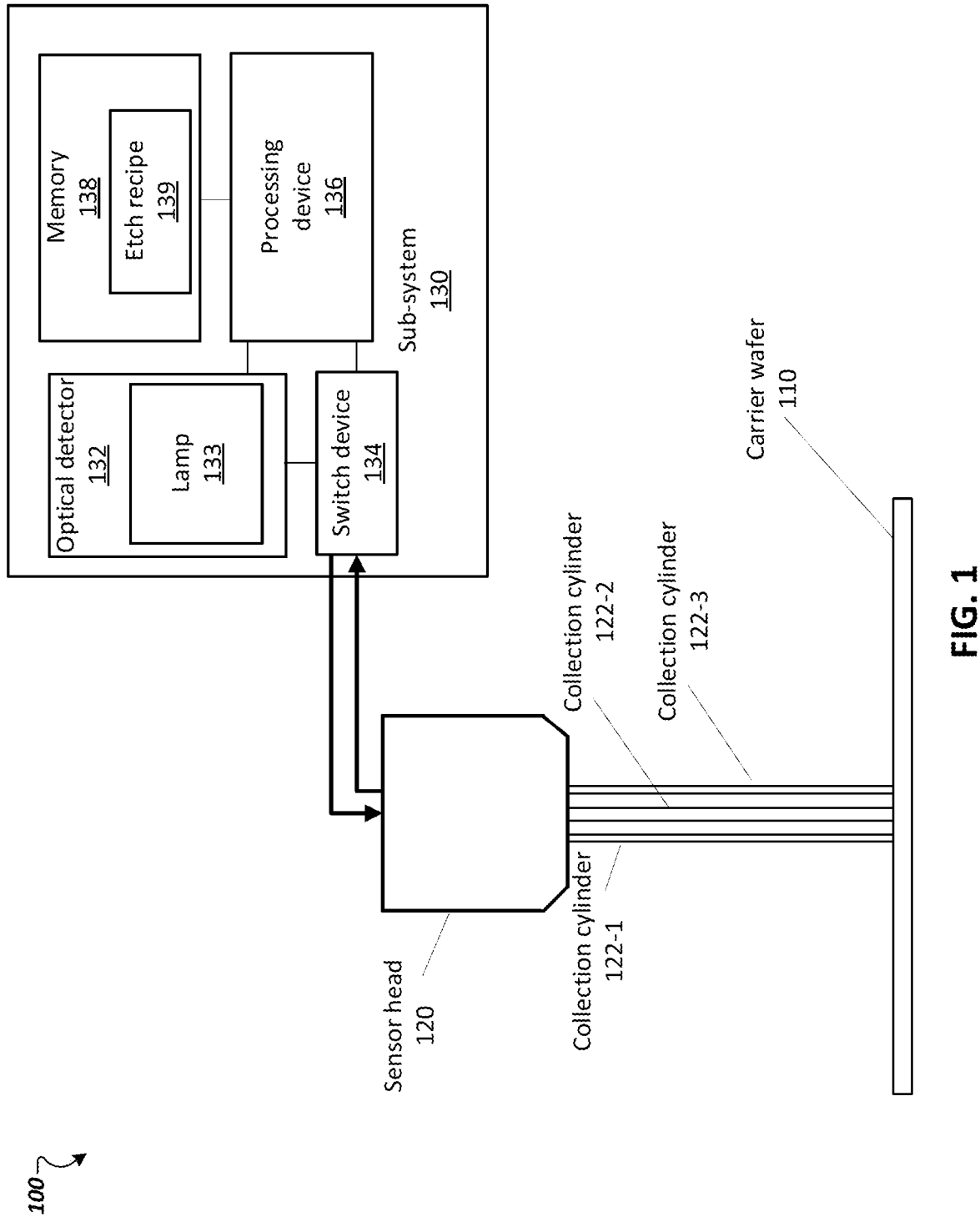
FIG. 1 is a diagram of a high-level overview of a multiple interferometric endpoint (MIEP) system to implement multiple reflectometry for measuring etch parameters, according to some embodiments.

Embodiments described herein relate to multiple reflectometry for measuring etch parameters. As etch process recipes are being developed to achieve a desired etch pattern, methods of obtaining feedback are limited. For example, methods of obtaining feedback include: (1) external metrology with wafers; (2) external metrology with coupons; (3) single point in-situ reflectometry; and (4) ellipsometry.

To perform external metrology with wafers, wafers with films of materials of interest can be premeasured with an ellipsometer or other external metrology. Wafers can be etched with a proposed etch process and then re-measured with external metrology. Etch selectivity can then be determined by comparing wafers with films of different materials.

To perform external metrology with coupons, similar to external metrology with wafers, coupons with films of materials of interest are placed on a carrier wafer. Each coupon can be baselined for film thickness with an ellipsometer or other external metrology. Selectivity can be determined by comparing etch rates of each material.

To perform single point in-situ reflectometry, a wafer or coupon on a carrier is measured in-situ with single point reflectometry, which is used to monitor etch rate during the etch process. Etch selectivity can then be determined by measuring each coupon/wafer separately. This method can require one wafer or one coupon on a carrier wafer, and one process per material.

With respect to ellipsometry, an in-situ ellipsometer can be added onto the etch chamber to measure a spot adjacent to the spot measured by reflectometry. However, an ellipsometer can be bulky and difficult to align, can require chamber modification, and the measurement method is different and must be calibrated. Accordingly, ellipsometry can be practically limited to allow only one additional measurement point.

The embodiments described herein can permit multiple reflectometry measurement points to be measured adjacent to each other for in-situ etch parameter (e.g., etch rate and/or selectivity) measurements. For example, four reflectometry measurement points can be demonstrated, although the number of reflectometry measurement points can depend on the specific application (e.g., at least seven reflectometry measurement points can fit in a window port). More specifically, a number of coupons (e.g., at least four coupons) with different films can be placed on a carrier wafer underneath a sensor head. The sensor head can include a number of collimators (e.g., four collimators). The coupons can be placed at locations relative to the wafer notch. Since locating coupons of the wafer relative to the wafer notch is part of the measurement setup, a jig or other suitable device can be used to accurately place the coupons on the carrier wafer. At least one lamp can be used to generate light that reflects off of the surface of the carrier wafer to perform the reflectometry. A switch device, such as an optical multiplexer ("multiplexer"), can be used to switch between each of the multiple reflectometry measurement points, thereby enabling the multiple reflectometry measurement points to be measured with a single optical detector. Alternatively, multiple optical detectors can be used instead of the switch device. The switch device can also be used to switch between each of the optical channels connected to the at least one lamp.

In some embodiments, the system includes a single lamp and a single optical detector. In some embodiments, the system includes multiple lamps and a single spectrometer. In some embodiments, the system includes a single lamp and multiple spectrometers. In some embodiments, the system includes multiple lamps and multiple spectrometers.

Moreover, the embodiments described herein provide for etch process recipe development and/or optimization using multiple reflectometry. Illustratively, an individual (e.g., process engineer) can identify a number of materials of interest to determine etch parameters (e.g., etch selectivity and/or etch rate). For example, the number of materials of interest can be at least four. Examples of materials of interest include, but are not limited to, oxides, photoresists, nitrides, polysilicon, etc. For each material of interest, it is determined how much area for each coupon is desired to match the "loading" of those materials of interest in a simulated process. Coupons can be cut and placed on a carrier wafer (e.g., using a jig for accurate coupon placement), such that there is one material of interest per measurement location.

Additional coupons could be added to simulate the appropriate material loading and/or different coupon sizes. The carrier wafer can then be placed in an enclosure (e.g., front opening unified pod (FOUP)) and loaded into the chamber using a robot. Data collection can then be initiated to measure film thickness, and a first iteration of the etch process can be performed. The film thickness can be measured with multiple reflectometry in real-time. One or more etch parameters (e.g., etch rate and/or etch selectivity) can be determined as a function of time as an etch process recipe is completed. Based on the results, one or more parameters of the etch process recipe (e.g., gas type, gas concentration, pressure, radio frequency (RF) power, RF pulsing) can be manually modified (e.g., by a process engineer) or automatically modified to achieve desired etch rate and/or etch selectivity. Automatic modification can use multivariate design of experiment (DoE) methods and/or machine learning techniques.

Embodiments described herein advantageously overcome the limitations of other measurement techniques by implementing multiple reflectometry techniques for measuring etch parameters. The embodiments described herein can achieve an etch process that has chemistry and process equipment parameters that provide good removal rate for the target etch material, while limiting the removal rate of other materials (e.g., underneath material and adjacent material).

FIG. 1 is a diagram of a high-level overview of a multiple interferometric endpoint (MIEP) system ("system") 100 to implement multiple reflectometry for measuring etch parameters. More specifically, as will be described in further detail below, the system 100 can analyze a plasma etch process performed in an etch chamber using an etch recipe, and results of the analysis can be used to develop and/or optimize the etch recipe. As shown, the system 100 includes a carrier wafer 110, a sensor head 120 and an etch recipe development sub-system ("sub-system") 130. The carrier wafer 110 can be placed on an electrostatic chuck or other suitable apparatus (not shown) to secure the carrier wafer 110.

The carrier wafer 110 and the sensor head 120 are included within an etch chamber. As will be described in further detail below with reference to FIG. 2, a number of coupons can be placed on the carrier wafer 110 and a material sample ("sample") can be placed on each coupon. In some embodiments, four coupons are placed on the carrier wafer each corresponding to a particular sample. However, the number of coupons should not be considered limiting. Each sample can include a different material of interest for measuring one or more etch parameters (e.g., etch rate and/or etch selectivity). For example, each sample can be a thin film.

The sensor head 120 houses a number of collimators arranged in parallel (not shown). In some embodiment, the sensor head 120 houses at least four collimators. Each collimator can be operatively coupled to a corresponding optical channel (e.g., fiber optic cable). An optical signal traveling via each optical channel can be received by its corresponding collimator, and the optical signals received by the collimator can be parallelized by a lens of the collimator into a collimated beam including collimated optical signals. An example of a collimator housed within the sensor head 120 will be described below with reference to FIG. 3.

The sub-system 130 includes an optical detector 132 operatively coupled to a switch device 134, a processing device 136 operatively coupled to the components 132 and 134, and a memory device 138 operatively coupled to the processing device 136. In some embodiments, the optical detector 132 is a spectrometer. As further shown, a lamp 133 is provided as a sub-component of the optical detector 132. Alternatively, the lamp 133 can be embodied as a separate or stand-alone component from the optical detector 132. The lamp 133 can be configured to generate a strong signal with minimal output (e.g., about 75% saturation). In some embodiments, the lamp 133 includes a flashtube or a flashlamp.

In this illustrative example, the system 100 includes the single lamp 133 and the single optical detector 132. In other embodiments, the system 100 includes multiple lamps and a single spectrometer. In other embodiments, the system 100 includes a single lamp and multiple spectrometers. In other embodiments, the system 100 includes multiple lamps and multiple spectrometers, such that there is no need for the switch device 134.

The system 100 can be used to develop and/or optimize an etch recipe based on an analysis of etch process iterations. In this example, it is assumed that four coupons are placed or mounted on the carrier wafer 110, and the sensor head 120 includes four collimators. However, such an embodiment should not be considered limiting. It is also assumed that an iteration of an etch process has been initiated based on an etch recipe 139 stored in the memory 138. The etch recipe 139 has etch recipe conditions (e.g., gas type, gas concentration, pressure, power, pulsing, etc.) that control the etch effect on the materials during the iteration of the etch process. As will be described in further detail below, an analysis of the material thickness of each material over time can be used to determine if one or more etch parameters (e.g., etch selectivity and/or etch rate) satisfy an etch parameter goal for the etch process.

A request to initiate the iteration of the etch process can be received by the processing device 136. The processing device 136 can cause the exposure of the carrier wafer 110 to etchants in a manner determined based on the etch recipe 139. To measure the one or more etch parameters during the iteration of the etch process, a data collection process can be performed using multiple reflectometry. For example, the sensor head 120 can receive input signals generated by the lamp 133 via optical channels (e.g., a bundle of fiber optic cables). Each of the collimators of the sensor head 120 corresponds to a collection cylinder for obtaining reflectometry measurements at different locations above the carrier wafer 110 corresponding to respective sampling points. In this illustrative example, there are collection cylinders 122-1 through 122-3 aimed at respective locations corresponding to three of the samples disposed on the carrier wafer 110. Although not shown, a fourth collection cylinder corresponding to a fourth sample on the carrier wafer 110 is occluded by the collection cylinder 122-2. Accordingly, four collection cylinders can be implemented.

Output signals are generated based on the spectral reflectance of the input signals generated by the lamp 133 off of their corresponding materials. More specifically, as the input signals reflect off the respective locations of the carrier wafer 110, some of the input signals are reflected from the incident surface and some are transmitted into the material. Another reflection can occur when these transmitted signals reach the bottom of the material. The incident optical signal reflections and the transmitted optical signal reflections constructively and/or destructively interfere with each other, depending on factors such as, e.g., wavelength, traveling distance, etc., thereby generating the output signals.

The output signals are routed via the optical channels to the switch device 134 to distribute and route the output signals to the optical detector 132. In some embodiments, the switch device 134 is a multiplexer. More specifically, the switch device 134 can switch individual optical channels (e.g., fibers) coupled to the lamp 133, and switch individual optical channels coupled to the optical detector 132 for performing analysis (e.g., spectroscopy) on the output signals in series. However, in alternative embodiments, multiple optical detectors and/or lamps can be used in place of the switch device 134, such that each optical channel and/or lamp is coupled to a corresponding optical detector.

A thickness of each sample on the carrier wafer 110 over time can be measured with (spectroscopic) reflectometry based on an analysis of the output signals obtained by the optical detector 132. More specifically, the thickness of each sample can be measured using any suitable model or equation to determine material thickness based on intensity and/or wavelength of the output signals. For example, the number of signals can increase as thickness increases. Emissions (e.g., plasma emissions) can be subtracted out from each reflectometry measurement in order to measure the amount of light that reflects off of the surface and into the collection cylinders.

The changes in thickness over time of the etch process can be used by the processing device 136 to measure one or more etch rate parameters of the respective material samples. That is, the one or more etch parameters can be measured as a function of time as the etch recipe is completed. Steps of the etch recipe 139 can result in different etch rates. Based on the results, one or more of the etch recipe conditions (e.g., gas type, gas concentration, pressure, power, pulsing, etc.) can be modified in order to achieve a desired etch parameter goal. In some embodiments, the etch recipe conditions are modified manually (e.g., a process engineer can manually modify the etch recipe conditions and repeat the data collection process). In some embodiments, the etch recipe conditions are modified automatically by the processing device 136. For example, the etch recipe conditions can be modified automatically by the processing device 136 using any suitable statistical methods (e.g., multi-variate DoE methods) and/or machine learning methods.

FIG. 2 is a top-down view of a carrier wafer apparatus 200, according to some embodiments. As shown, carrier wafer apparatus 200 includes a carrier wafer 210, such as the carrier wafer 110 described above with reference to FIG. 1. The carrier wafer 210 can have a wafer notch 220, and a number of coupons 230-1 through 230-4 can be placed or mounted at the center of the carrier wafer 210. Although four coupons 230-1 through 230-4 are shown in this illustrative example, any suitable number of coupons can be placed on the carrier wafer 210 in accordance with the embodiments described herein. Each of the coupons 230-1 through 230-4 can have a respective sample 240-1 through 240-4 disposed thereon. The location of the coupons 230-1 through 230-4 on the carrier wafer 210 relative to the wafer notch 220 can be used as part of the multiple reflectometry measurement process described herein. For example, a jig can be used to accurately place the coupons 230-1 through 230-4 relative to the wafer notch 220.

Each sample 240-1 through 240-4 can include a different material of interest for measuring one or more etch parameters (e.g., etch rate and/or etch selectivity). An etch recipe corresponding to one of the samples 240-1 through 240-4 can be analyzed using the multiple reflectometry measurement process, and a thickness of each of the samples 240-1 through 240-4 can be measured over time as each step of the etch recipe is performed. The process can be repeated for other etch recipes corresponding to other ones of the samples 240-1 through 240-4. Therefore, removal rates for each etch recipe can monitored with an MIEP system, such as the system 100 of FIG. 1, and etch parameters can be determined for each of the etch recipes. Accordingly, multiple recipe analyses can be conducted to identify optimal etch selectivity. For example, with multiple in-situ measurements, statistical methods (e.g., multi-variate DoE) and/or machine learning can be used to automatically obtain optimal etch recipe solutions.

As an illustrative example, the sample 240-1 can be an oxide film sample, the sample 240-2 can be a photoresist film sample, the sample 240-3 can be a nitride film sample, and the sample 240-4 can be a polysilicon film sample. Each of the oxide film sample, photoresist film sample, nitride film sample, and polysilicon film sample can have a corresponding etch recipe that can be analyzed. Further details regarding this example are described below with reference to FIG. 5.

FIG. 3 is a diagram of an example collimator assembly 300. As shown, the collimator assembly 300 includes a collimator 310 including a lens 312. An optical channel 320 (e.g., fiber optic cable) is coupled to the collimator 310. The optical channel 320 can carry an optical signal. The lens 312 is designed to parallelize received optical signals to generate collimated beams. A focal length "FL" is defined as a distance between the connection of the optical fiber 320 to the collimator 310 and the lens 312. Parameters such as size of the optical channels, lens type, focal length, etc. can be adjusted to achieve sufficient collimation.

The collimator 310 can be housed within a sensor head, such as the sensor head 120 described above with reference to FIG. 1. More specifically, multiple ones of the collimators 310 can be housed within the sensor head, each with a corresponding optical channel 320 coupled thereto and associated with a collection cylinder directed at a location of a sample disposed on a carrier wafer.

Figure 4:
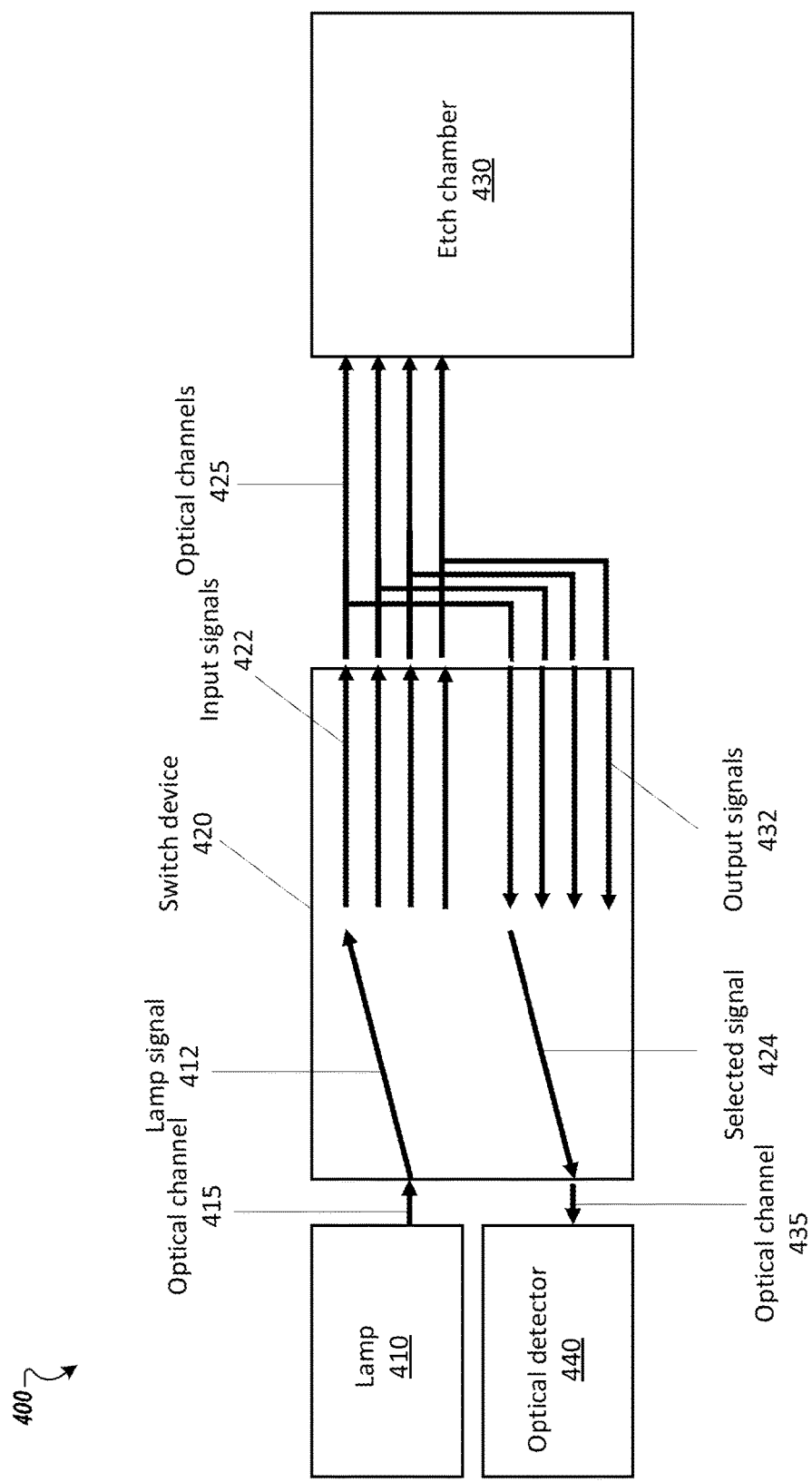
FIG. 4 is a diagram of an etch recipe development sub-system, according to some embodiments.

FIG. 4 is a diagram of an etch recipe development sub-system ("sub-system") 400. As shown, the sub-system 400 includes a lamp 410, a switch device 420 (e.g., a multiplexer), an etch chamber 430, and an optical detector 440 (e.g., spectrometer).

The lamp 410 is configured to generate a lamp signal 412 that is sent to the switch device 420 through an optical channel (e.g., fiber optic cable). Upon receipt of the lamp signal, the switch device 420 can generate multiple input signals 422. The number of input signals 422 can be equal to the number of samples disposed on a carrier wafer (e.g., on respective coupons) located within the etch chamber 430. In this illustrative embodiment, there are four input signals 422 corresponding to four respective samples disposed on the carrier wafer. Output signals 432 are generated during the performance of an etch process within the etch chamber 430, with each of the output signals 432 being received by a corresponding collection cylinder associated with a collimator and sent to the switch device 420 via respective ones of optical channels 425. The switch device 420 can select one of the output signals 432 at a time as a selected signal 424 to be sent to the optical detector 440 via an optical channel 435 for analysis. In alternative embodiment, instead of having the switch device 420, each of the output signals 432 can be sent to a respective optical detector. The input path and the output path can be switched in tandem.

Figure 5:
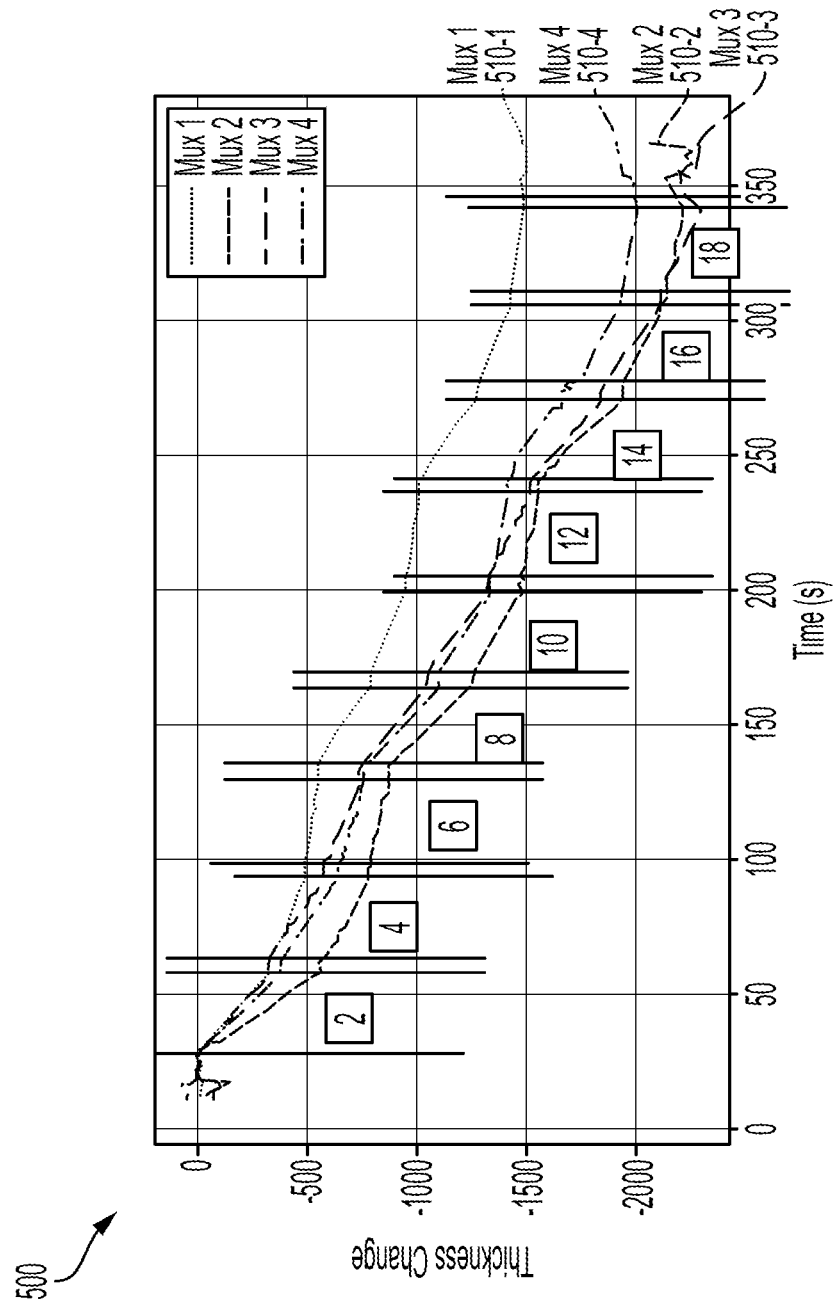
FIG. 5 is a graph showing thickness change over time observed for an etch recipe applied to multiple samples, according to some embodiments.

FIG. 5 is a graph 500 showing thickness change over time observed for an etch recipe applied to multiple samples, according to some embodiments. More specifically, a thickness change over time is observed for a first sample selected by a switch device (in this example a multiplexer) denoted as "Mux 1" 510-1, a second sample selected by the switch device denoted as "Mux 2" 510-2, a third sample selected by the switch device denoted as "Mux 3" 510-3, and a fourth sample selected by the switch device denoted as "Mux 4" 510-4. The x-axis of the graph 500 indicates time (s), and the y-axis of the graph 500 indicates thickness change 500 in millimeters (mm).

In this illustrative embodiment, Mux 1 510-1 can be an oxide, Mux 2 510-2 can be a photoresist, Mux 3 510-3 can be a nitride, and Mux 4 can be polysilicon, and the etch recipe can be an oxide etch recipe corresponding to the oxide. The oxide etch recipe can include multiple steps that are iterated a suitable number of times. For example, in this example, a first step ("2") can be a carbon tetrafluoride ($CF_4$)—Argon (Ar) step, a second step ("4") can be a $CF_4$—trifluoromethane ($CHF_3$)—Ar step, and a third step ("6") can be a $CHF_3$—Ar step iterated three times (i.e., steps "8" and "14" are also $CF_4$—Ar steps, steps "10" and "16" are also $CF_4$—$CHF_3$—Ar steps, and steps "12" and 18" are also $CHF_3$—Ar steps). The lines on the graph 500 indicate the start and end points of each step.

As shown in graph 500, a thickness change from time 0 has been observed for each of the samples Mux 1 510-1 through Mux 2 510-4 using this oxide etch recipe, meaning that the oxide etch recipe has poor etch selectivity. It is noted that with some other etch recipes, a substantive thickness change may be observed in only one of the samples Mux 1 510-1 through Mux 2 510-4, thereby exhibiting good etch selectivity. For example, a photoresist etch recipe can result in a substantive thickness change observed in only Mux 2 510-2, indicating good etch selectivity.

Figure 6:
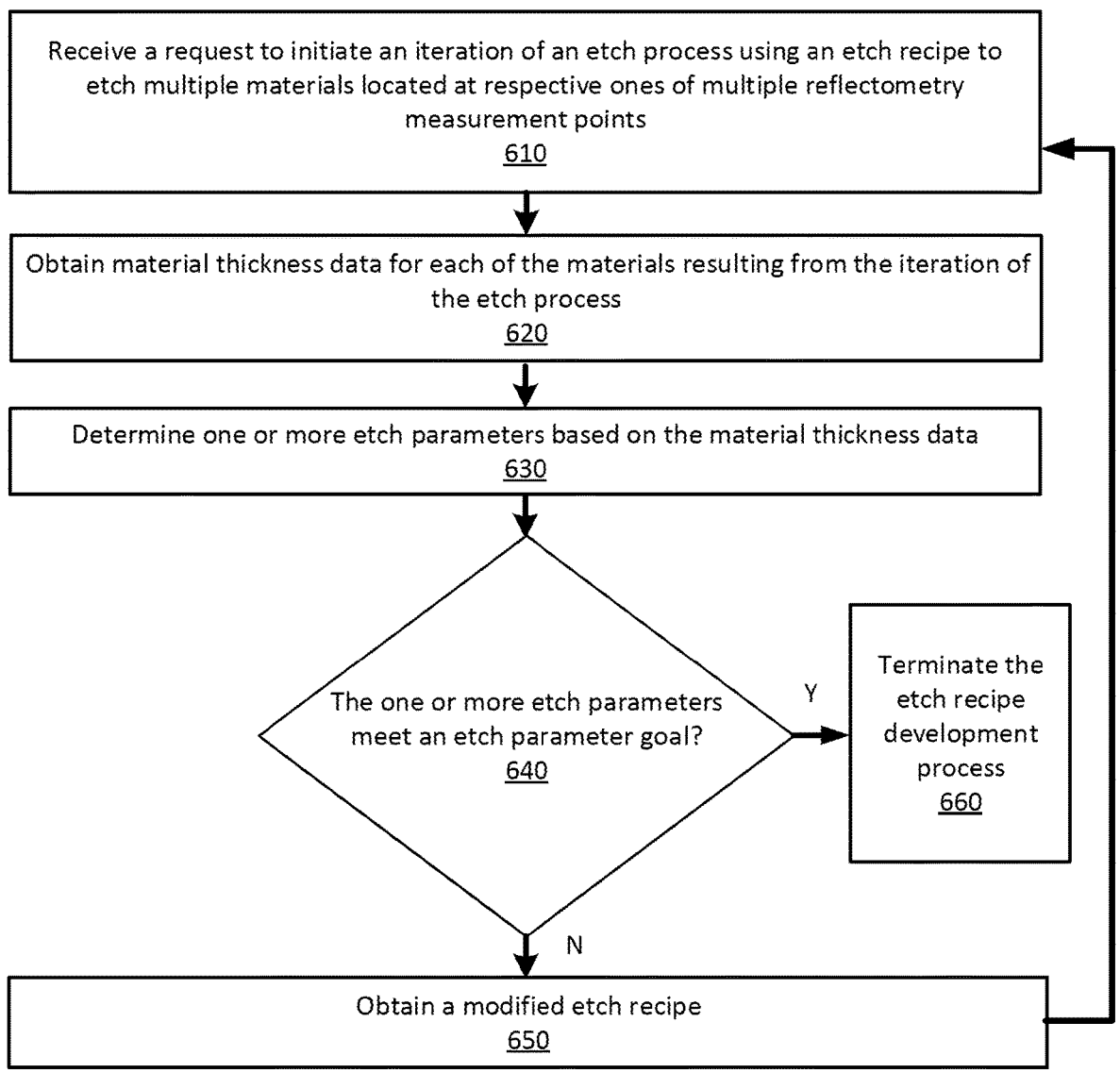
FIG. 6 is a flow diagram of a method to implement multiple reflectometry for measuring etch parameters, according to some embodiments.

FIG. 6 is a flow diagram of a method 600 to implement an etch recipe development process using multiple reflectometry, according to some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the processing device 136 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a request to initiate an iteration of an etch process using an etch recipe to etch multiple materials located at respective ones of multiple reflectometry measurement points. The multiple materials are predetermined as materials of interest to determine etch rate and/or etch selectivity. The multiple materials can correspond to respective coupons placed on a carrier wafer. More specifically, a different material can be placed per measurement point. Additional coupons could be added to simulate appropriate material loading (or different coupon sizes). The carrier wafer can then be placed in an enclosure (e.g., a Front Opening Unified/Universal Pod (FOUP)) and loaded into the etch chamber with a robot to be subject to the etch process.

At operation 620, the processing logic obtains material thickness data for each of the materials resulting from the iteration of the etch process. For example, the processing logic, after receiving the request, can cause the exposure of the multiple materials to etchants as determined by the etch recipe. The thickness of one or more of the materials can decrease over time as a result of the etch recipe being used.

More specifically, the processing logic can obtain the material thickness data based on an analysis performed by at least one optical detector. For example, at least one lamp can generate light for reflection off of the carrier wafer during the etch process, collection cylinders corresponding to multiple collimators can collect the reflections to generate output signals, and the output signals can be transmitted to the at least one optical detector to generate results based on an analysis of the wavelength and/or intensity of the output signals. For example, the at least one optical detector can be a spectrometer, and the multiple collimators can be housed in a sensor head. The processing logic can process the results generated by the at least one optical detector to obtain the material thickness data. In some embodiments, the at least one optical detector is a single optical detector operatively coupled to a switch device (e.g., a multiplexer). In alternative embodiments, the at least one optical detector includes multiple optical detectors each configured to receive a respective one of the output signals.

At operation 630, the processing logic determines one or more etch parameters based on the material thickness data. The one or more etch parameters can include at least one of etch rate and etch selectivity. For example, the etch rate for a given material can be calculated based on the change in thickness over time. The etch selectivity can be calculated by comparing the changes in thickness over time between at least two of the materials. For example, if a given material shows high removal in response to the etch recipe while the other materials show low removal in response to the etch recipe, the given material has relatively high etch selectivity.

At operation 640, the processing logic determines if the one or more etch parameters meet an etch parameter goal. For example, the etch parameter goal can include a threshold etch selectivity and/or threshold etch rate to be achieved. The etch parameter goal can be one or more values (e.g., a particular etch selectivity and/or a particular etch rate), or can be a range of values (e.g., a range of etch selectivities and/or a range of etch rates).

If the one or more etch parameters fail to meet the etch parameter goal at operation 640, the processing logic obtains a modified etch recipe at operation 650, and the processing logic can receive another request to initiate another iteration of the etch process using the modified etch recipe at operation 610. In some embodiments, the modified etch recipe can be obtained by receiving a manual modification of one or more etch recipe conditions. Examples of etch recipe conditions include, but are not limited to, gas type, gas concentration, pressure, RF power, and RF pulsing. In some embodiments, obtaining the modified etch recipe includes automatically modifying the etch recipe. More specifically, one or more etch recipe conditions can be automatically modified or adjusted based on the etch parameter goal. For example, automatic recipe modification can be performed using any suitable statistical methods (e.g., multi-variate DoE methods) and/or machine learning methods in accordance with the embodiments described herein.

If the one or more etch parameters meet an etch parameter goal, this means that the etch recipe conditions are satisfactory. Thus, the etch recipe development process can be terminated at block 660.

Figure 7:
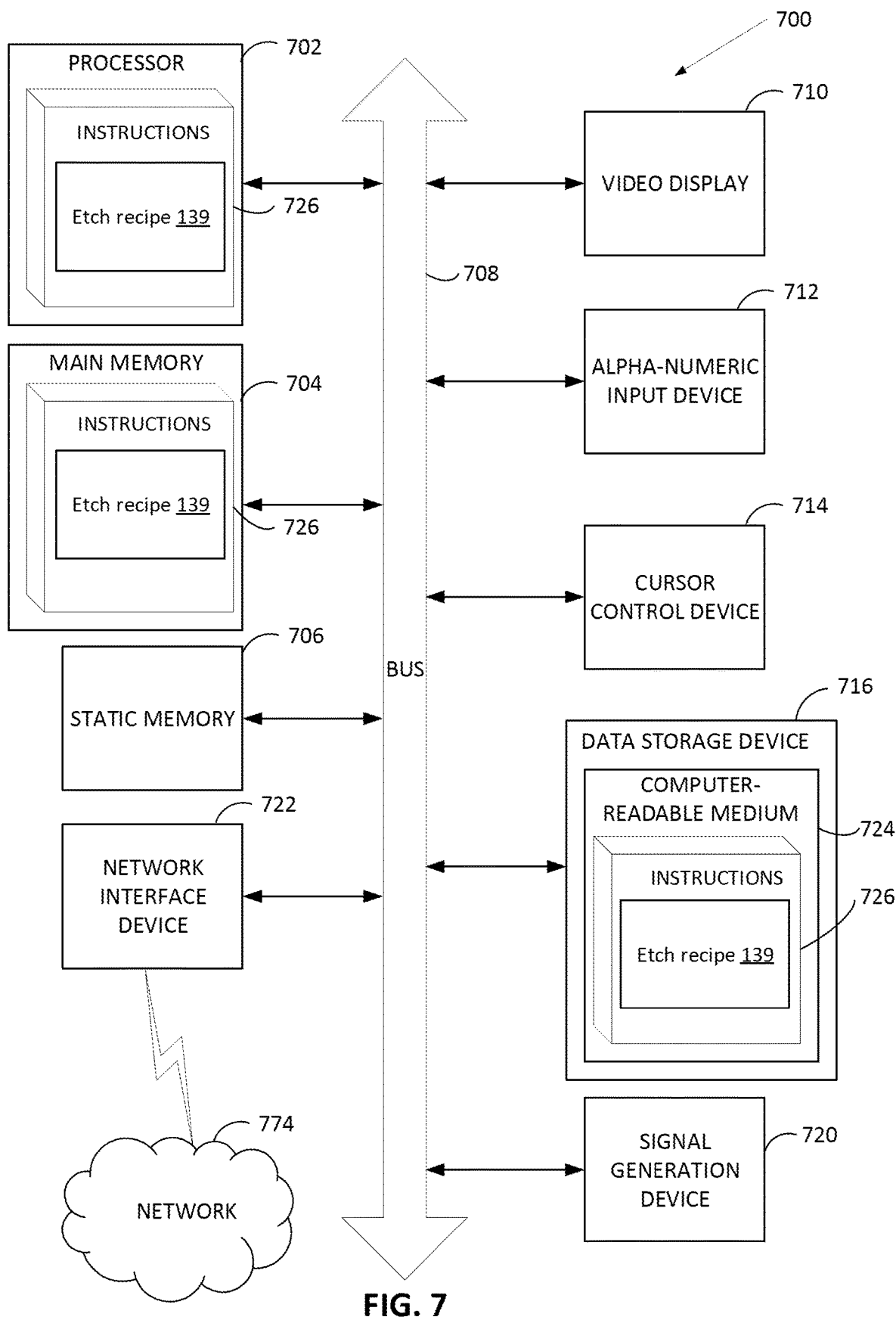
FIG. 7 is a block diagram illustrating a computer system, according to certain embodiments.

FIG. 7 is a block diagram illustrating a computer system 700, according to certain embodiments. In some embodiments, the computer system 700 is included within the sub-system 130 of FIG. 1.

In some embodiments, computer system 700 is connected (e.g., via a network, such as a Local Area Network (LAN), an intranet, an extranet, or the Internet) to other computer systems. In some embodiments, computer system 700 operates in the capacity of a server or a client computer in a client-server environment, or as a peer computer in a peer-to-peer or distributed network environment. In some embodiments, computer system 700 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 700 includes a processing device 702, a volatile memory 704 (e.g., Random Access Memory (RAM)), a non-volatile memory 706 (e.g., Read-Only Memory (ROM) or Electrically-Erasable Programmable ROM (EEPROM)), and a data storage device 716, which communicate with each other via a bus 708.

In some embodiments, processing device 702 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 700 further includes a network interface device 722 (e.g., coupled to network 774). In some embodiments, computer system 700 also includes a video display unit 710 (e.g., an LCD), an alphanumeric input device 712 (e.g., a keyboard), a cursor control device 714 (e.g., a mouse), and a signal generation device 720.

In some implementations, data storage device 716 includes a non-transitory computer-readable storage medium 724 on which store instructions 726 encoding any one or more of the methods or functions described herein. For example, the instructions 726 can include the etch recipe component 139 of FIG. 1, which, when executed, can implement a method for etch recipe development, such as the method 600 of FIG. 6.

In some embodiments, instructions 726 also reside, completely or partially, within volatile memory 704 and/or within processing device 702 during execution thereof by computer system 700, hence, in some embodiments, volatile memory 704 and processing device 702 also constitute machine-readable storage media.

While computer-readable storage medium 724 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "training," "identifying," "further training," "re-training," "causing," "receiving," "providing," "obtaining," "optimizing," "determining," "updating," "initializing," "generating," "adding," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A system comprising:
 a memory storing instructions to facilitate an etch recipe development process; and
 at least one processing device operatively coupled to the memory, wherein the instructions, upon execution by the at least one processing device, cause the at least one processing device to facilitate the etch recipe development process by performing operations comprising:
  obtaining, from an optical detector, first material thickness data for a first material and second material thickness data for a second material resulting from an iteration of an etch process using an etch recipe, wherein the first material is located at a first reflectometry measurement point and the second material is located at a second reflectometry measurement point different from the first reflectometry measurement point; and
  determining one or more etch parameters based on at least the first material thickness data and the second material thickness data.

2. The system of claim 1, wherein the first material and the second material are each disposed on a respective coupon on a carrier wafer.

3. The system of claim 1, wherein the first reflectometry measurement point corresponds to a first collection cylinder associated with a first collimator located above the first reflectometry measurement point, and wherein the second reflectometry measurement point corresponds to a second collection cylinder associated with a second collimator located above the second reflectometry measurement point.

4. The system of claim 1, wherein the operations further comprise enabling the optical detector to selectively measure the first material thickness data and the second material thickness data.

5. The system of claim 1, wherein the one or more etch parameters comprise at least one of: etch selectivity or etch rate.

6. The system of claim 1, wherein the operations further comprise:
 determining whether the one or more etch parameters fail to meet an etch parameter goal;
 obtaining a modified etch recipe in response to determining that the one or more etch parameters fail to meet the etch parameter goal; and
 initiating a second iteration of the etch process using the modified etch recipe.

7. The system of claim 6, wherein obtaining the modified etch recipe further comprises automatically modifying one or more etch recipe conditions of the etch recipe.

8. The system of claim 7, wherein the one or more etch recipe conditions comprise at least one of: gas type, gas concentration, pressure, RF power, or RF pulsing.

9. The system of claim 1, wherein the operations further comprise:
 determining whether the one or more etch parameters meet an etch parameter goal; and
 terminating the etch recipe development process in response to determining that the one or more etch parameters meet the etch parameter goal.

10. A method comprising:
 obtaining, by at least one processing device from an optical detector, first material thickness data for a first material and second material thickness data for a second material resulting from an iteration of an etch process using an etch recipe, wherein the first material is located at a first reflectometry measurement point and the second material is located at a second reflectometry measurement point different from the first reflectometry measurement point; and
 determining, by the at least one processing device, one or more etch parameters based on at least the first material thickness data and the second material thickness data.

11. The method of claim 10, wherein the first material and the second material are each disposed on a respective coupon on a carrier wafer.

12. The method of claim 10, wherein the first reflectometry measurement point corresponds to a first collection cylinder associated with a first collimator located above the first reflectometry measurement point, and wherein the second reflectometry measurement point corresponds to a second collection cylinder associated with a second collimator located above the second reflectometry measurement point.

13. The method of claim 10, wherein the one or more etch parameters comprise at least one of: etch selectivity or etch rate.

14. The method of claim 10, further comprising:
   determining, by the at least one processing device, whether the one or more etch parameters fail to meet an etch parameter goal;
   obtaining, by the at least one processing device, a modified etch recipe in response to determining that the one or more etch parameters fail to meet the etch parameter goal; and
   initiating, by the at least one processing device, a second iteration of the etch process using the modified etch recipe.

15. The method of claim 14, wherein obtaining the modified etch recipe further comprises automatically modifying one or more etch recipe conditions of the etch recipe.

16. The method of claim 10, further comprising:
   determining, by the at least one processing device, whether the one or more etch parameters meet an etch parameter goal; and
   terminating, by the at least one processing device, an etch recipe development process in response to determining that the one or more etch parameters meet the etch parameter goal.

17. A system comprising:
   an optical detector, operatively coupled to a switch device, to selectively measure material thickness data resulting from an iteration of an etch process;
   a memory storing instructions to facilitate an etch recipe development process; and
   at least one processing device operatively coupled to the memory, the optical detector and the switch device, wherein the instructions, upon execution by the at least one processing device, cause the at least one processing device to facilitate the etch recipe development process by determining one or more etch parameters based on at least first material thickness data for a first material and second material thickness data for a second material, wherein the first material is located at a first reflectometry measurement point and the second material is located at a second reflectometry measurement point different from the first reflectometry measurement point.

18. The system of claim 17, wherein the first material and the second material are each disposed on a respective coupon on a carrier wafer.

19. The system of claim 17, wherein the first reflectometry measurement point corresponds to a first collection cylinder associated with a first collimator located above the first reflectometry measurement point, and wherein the second reflectometry measurement point corresponds to a second collection cylinder associated with a second collimator located above the second reflectometry measurement point.

20. The system of claim 17, wherein the one or more etch parameters comprise at least one of: etch selectivity or etch rate.

* * * * *